United States Patent
Sleight

(10) Patent No.: US 7,687,365 B2
(45) Date of Patent: Mar. 30, 2010

(54) CMOS STRUCTURE FOR BODY TIES IN ULTRA-THIN SOI (UTSOI) SUBSTRATES

(75) Inventor: Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/925,136

(22) Filed: Oct. 26, 2007

(65) Prior Publication Data

US 2008/0248615 A1    Oct. 9, 2008

Related U.S. Application Data

(62) Division of application No. 10/906,178, filed on Feb. 7, 2005, now abandoned.

(51) Int. Cl.
*H01L 21/336* (2006.01)
(52) U.S. Cl. .................. 438/306; 438/300; 438/305; 438/311; 257/E21.619; 257/E21.634
(58) Field of Classification Search ............. 438/311, 438/347, 300, 303, 305, 306; 257/E21.619, 257/E21.634
See application file for complete search history.

(56) References Cited

U.S. PATENT DOCUMENTS

| | | | |
|---|---|---|---|
| 5,116,771 A | 5/1992 | Karulkar | |
| 5,930,605 A | 7/1999 | Mistry et al. | |
| 6,429,477 B1 | 8/2002 | Mandelman et al. | |
| 6,633,066 B1 | 10/2003 | Bae et al. | |
| 6,686,629 B1 | 2/2004 | Assaderaghi et al. | |
| 6,764,901 B2 | 7/2004 | Noble et al. | |
| 6,798,009 B2 | 9/2004 | Forbes et al. | |
| 6,821,833 B1 | 11/2004 | Chou et al. | |
| 2003/0057487 A1 | 3/2003 | Yamada et al. | |
| 2003/0151112 A1* | 8/2003 | Yamada et al. | 257/510 |
| 2004/0256700 A1 | 12/2004 | Doris et al. | |
| 2005/0093104 A1* | 5/2005 | Ieong et al. | 257/627 |
| 2005/0116290 A1 | 6/2005 | de Souza et al. | |
| 2005/0202600 A1 | 9/2005 | Yamashita et al. | |
| 2007/0246767 A1* | 10/2007 | Osada et al. | 257/314 |
| 2008/0044983 A1* | 2/2008 | Nagano et al. | 438/455 |

* cited by examiner

*Primary Examiner*—Long K Tran
(74) *Attorney, Agent, or Firm*—Scully, Scott, Murphy & Presser, P.C.; Joseph P. Abate, Esq.

(57) ABSTRACT

The present invention provides a semiconducting structure including a substrate having an UTSOI region and a bulk-Si region, wherein the UTSOI region and the bulk-Si region have a same crystallographic orientation; an isolation region separating the UTSOI region from the bulk-Si region; and at least one first device located in the UTSOI region and at least one second device located in the bulk-Si region. The UTSOI region has an SOI layer atop an insulating layer, wherein the SOI layer has a thickness of less than about 40 nm. The bulk-Si region further comprises a well region underlying the second device and a contact to the well region, wherein the contact stabilizes floating body effects.

12 Claims, 4 Drawing Sheets

CMOS STRUCTURE FOR BODY TIES IN ULTRA-THIN SOI (UTSOI) SUBSTRATES

RELATED APPLICATIONS

This application is a divisional of U.S. patent application Ser. No. 10/906,178, filed Feb. 7, 2005 now abandoned.

FIELD OF THE INVENTION

The present invention relates to semiconductor devices, and more particularly to integrated semiconductor devices, such as complementary metal oxide semiconductor (CMOS) devices formed atop a substrate having an ultra thin silicon-on-insulator (UTSOI) portion and a bulk-Si portion, wherein the UTSOI and bulk-Si portions of the substrate have the same crystalline orientation. In particular, the present invention forms nFET and pFET devices on UTSOI and bulk-Si regions of a semiconducting substrate both having a surface on a (100) or (111) crystal plane. The bulk-Si region of the substrate may be processed to provide devices substantially free of floating body effects that are typically present in the devices formed with UTSOI substrates.

BACKGROUND OF THE INVENTION

Silicon-on-insulator (SOI) devices offer several advantages over more conventional semiconductor devices. For example, SOI devices may have lower power consumption requirements than other types of devices that perform similar tasks. SOI devices may also have lower parasitic capacitances than non-SOI devices. This translates into faster switching times for the resulting circuits. In addition, the phenomenon of "latchup," which is often exhibited by complementary meta-oxide semiconductor (CMOS) devices, may be avoided when circuit devices are manufactured using SOI fabrication processes. sOI devices are also less susceptible to the adverse effects of ionizing radiation and, therefore, tend to be more reliable in applications where ionizing radiation may cause operation errors.

SOI has been implemented in high performance CMOS integrated circuits (ICs) with a floating body node. A floating body node causes the floating body effect, which makes circuit design challenging. One example of floating body effect is the history effect that a designer needs to margin for when designing ICs. History effect means that the circuit delay is a function of the previous status of the circuit as determined by switching of the gate and drain transistor signals. Floating body effect modulates the device threshold voltage in static CMOS circuits, for example, such that a threshold voltage change causes the device drive current to vary, which in turn causes changes in circuit delay. History effect refers to this variability in delay and is determined based on input history and conditions prior to switching activity. The history effect of the delay in SOI is a design obstacle for adopting SOI technology.

Body contacts are intended to prevent the floating body effect. The floating body effect is particularly important in metal oxide semiconducting (MOS) analog technology. A node having a predetermined direct current (DC) voltage is connected to the body of a transistor when designing MOS analog circuits in order to prevent the floating body effect. The low voltage source or the high voltage source of a chip is connected to the body of a transistor depending on the type of the body in an analog circuit. Even in the case of SOI metal oxide semiconducting field effect transistors (MOSFETs) used in digital applications, bodies of transistors sometimes may have predetermined voltages applied so that the body floating effect does not occur.

Body contacts are typically positioned adjacent to SOI devices, being separated from the source and drain regions of the device by isolation regions. Therefore, body contacts are electrically connected to the SOI devices through a portion of the device having a low dopant concentration, since the higher concentration of dopants are positioned in closer proximity to the device channel by means of halo dopants and source/drain extensions. For the purposes of providing electrical connectivity of the body contact to the device, the low dopant concentration portion of the device has a higher resistance than the more highly doped portions of the device.

In order to be able to make ICs, such as memory, logic, and other devices, of higher integration density than currently feasible, one has to find a way to further downscale the dimensions of field effect transistors (FETs), such as MOSFETs and CMOS devices. Scaling achieves compactness and improves operating performance in devices by shrinking the overall dimensions and operating voltages of the device, while maintaining the device's electrical properties.

UTSOI devices having a thickness of about 40 nm or less are a promising option to further continue SOI CMOS device scaling. In comparison to conventional SOI devices, UTSOI devices provide a sharper sub-threshold slope (measure of the abruptness of the switching of the device), higher mobility (because the device is operated at a lower effective field) and better short channel effect control.

A disadvantage of UTSOI devices is that as the SOI film (upper Si-containing layer of SOI substrate) is thinned, the series resistance increases. The increasing series resistance of the thin SOI layer in conjunction with the low dopant concentration of the portion of the device to which body contacts typically contact SOI devices substantially reduces the effectiveness of the body contacts to eliminate the effects of floating body effects. Despite the advantages of UTSOI devices, some applications of semiconducting devices require that floating body effects be substantially eliminated.

In view of the above, there is a need for providing the performance enhancements of UTSOI for the majority of devices, while providing a means to substantially eliminate floating body effects for select devices.

Additionally, it is known within the art, that nFET devices formed atop a (110) crystal plane have decreased carrier mobility and switching speed. There is a need to provide an integrated semiconducting device in which each device is formed on a portion of a substrate having the same crystalline orientation, wherein that crystalline orientation is selected to ensure that nFET devices are not formed atop a (110) crystal plane.

SUMMARY OF THE INVENTION

One object of the present invention is to provide a method of providing a substrate having bulk-Si regions and UTSOI regions, in which the crystallographic orientation of the surface of the bulk-Si region is the same as the crystallographic orientation of the surface of the UTSOI region.

Another object of the present invention is to provide a CMOS device incorporating field effect transistors (FETS) on a UTSOI substrate region having a device channel capable of being fully depleted of charger carriers in combination with FETs within a bulk-Si region having a body contact, which substantially eliminates full body effects.

A further object of the present invention is to provide a substrate having a UTSOI region and a bulk-Si region, in which the surface of the UTSOI region and the bulk-Si region has a crystalline orientation in a (100) or (111) crystal plane. Broadly, and in specific terms, the objects and advantages of the present invention are provided by a semiconducting structure comprising:

a substrate comprising an UTSOI region and a bulk-Si region, wherein said UTSOI region and said bulk-Si region have a same crystallographic orientation;

an isolation region separating said UTSOI region from said bulk-Si region; and at least one first device located in said UTSOI region and at least one second device located in said bulk-Si region.

In accordance with the present invention, the UTSOI region of the substrate comprises an SOI layer having a thickness that is capable of being fully depleted of charge carriers when the device is forward biased. The bulk-Si region further comprises a well region underlying the device formed thereon and a body contact to the well region, wherein the body contact stabilizes floating body effects.

The UTSOI region may include at least one nFET device, at least one pFET device, or combinations thereof. The bulk-Si region may include at least one nFET, pFET, resistor, capacitor, diode or a combination thereof. The resistor is typically formed using a highly doped region of bulk silicon. The capacitor is typically fabricated from a large FET structure where source and drains are tied together as one capacitor terminal and the gate is the other capacitor terminal. The diode is typically, but not always, formed in bulk silicon from adjacent n+/p+ implants. In all cases, these devices are difficult, if not impossible, to implement in UTSOI layers due to the high body resistance.

The above structure can be provided by utilizing a method that includes wafer bonding, masking, etching and regrowth of a semiconductor layer. Specifically, the method of the present invention comprises the steps of:

providing a substrate comprising at least a first semiconductor layer and a second semiconductor layer separated by an insulating layer, said first semiconductor layer and said second semiconductor layer having a same crystalline orientation;

protecting a portion of the substrate to define an UTSOI region, while leaving another portion of the substrate unprotected, said unprotected portion of the substrate defining a bulk-Si region;

etching said unprotected portion of the substrate to expose a surface of the second semiconductor layer;

regrowing a semiconductor material on said exposed surface of the second semiconductor layer, said semiconductor material having said same crystalline orientation;

planarizing the substrate containing the semiconductor material so that an upper surface of the first semiconductor layer is substantially planar with an upper surface of the semiconductor material; and forming at least one first device in said UTSOI region, while forming at least one second device on said semiconductor material in said bulk-Si region.

In accordance with the present invention, the second device within the bulk-Si region can be formed by implanting the bulk-Si region with a first type dopant to provide a well region, forming at least one gate region atop a surface of the bulk-Si region, forming source and drain regions adjacent at least one gate region with a second type dopant, and forming a contact to the well region, wherein the contact stabilizes floating body effects. Forming the contact to the well region comprises etching a portion of the surface of the bulk-Si region to provide a via to the well region; and filling the via to the well region with a conductive material.

DETAILED DESCRIPTION OF THE INVENTION

Figure 1A:
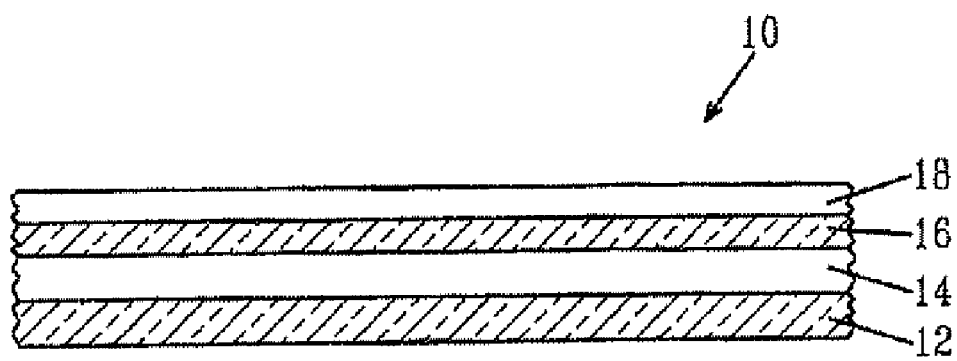
FIGS. 1A-1F are pictorial representations (through cross sectional views) illustrating the basic processing steps used in forming a CMOS device containing high performance UTSOI channel MOSFET semiconductor devices having body contacts, wherein each MOSFET is formed on a surface having a (100) crystal plane.

The present invention, which provides a method of forming semiconductor devices atop a substrate containing an UTSOI region and a bulk-Si region, in which the crystallographic orientation of the UTSOI region and the bulk-Si region is the same, will now be described in greater detail by referring to the following discussion as well as the drawings that accompany the present application. In the accompanying drawings, like and correspondence elements are referred to by like reference numerals.

FIG. 1A illustrates a substrate 10, i.e., hybrid substrate, which may be employed in the present invention. As shown, the substrate 10 includes a surface dielectric layer 18, a first semiconductor layer 16, an insulating layer 14, and a second semiconductor layer 12.

The surface dielectric layer 18 of the substrate 10 is an oxide, nitride, oxynitride or other insulating layer that is either present in one of the initial wafers before bonding, or formed atop the first semiconductor layer 16 after wafer bonding by either a thermal process (i.e., oxidation, nitridation or oxynitridation) or by deposition. Notwithstanding the origin of the surface dielectric layer 18, the surface dielectric layer 18 has a thickness from about 3 nm to about 500 nm, with a thickness from about 5 nm to about 20 nm being more typical.

The first semiconductor layer 16 is comprised of any semiconducting material including, for example, Si, SiC, SiGe, SiGeC, Ge alloys, GaAs, InAs, InP as well as other III/V or II/VI compound semiconductors. First semiconductor layer 16 may also comprise an SOI layer of a preformed SOI substrate or a layered semiconductor such as, for example, Si/SiGe. The first semiconductor layer 16 has the same crystalline orientation as the second semiconductor layer 12, preferably being in the (100) crystal plane. Although a (100) crystal orientation is preferred, the first semiconductor layer 16 may have a (111) crystal plane, (110) crystal plane or other crystal plane, so long as the first semiconducting layer 16 is not a Si-containing material that is subsequently processed to provide an nFET device on a (110) crystal plane.

The thickness of the first semiconductor layer 16 may vary depending on the initial starting wafers used to form the substrate 10. Typically, however, the first semiconductor layer 16 has a thickness from about 5 to about 100 nm. The first semiconductor layer 16 is thinned to a desired thickness by planarization, grinding, wet etch, dry etch or any combination thereof. In a preferred embodiment, the first semiconductor layer 16 is thinned by oxidation and wet etching to achieve the desired thickness to provide the upper Si-containing layer of an ultra-thin silicon-on-insulator substrate for the purpose of this disclosure. The term "ultra-thin silicon-on-insulator (UTSOI) substrate" denotes a silicon-on-insulating substrate having an upper silicon containing layer (SOI layer) that fully depletes of charge carriers when a field effect transistor (FET) is formed atop the upper silicon-containing layer and is forward biased. The first semiconductor layer 16 typically has a thickness of less than about 40 nm, more typically less than about 15 nm. The first semiconductor layer 16 is subsequently processed to provide the SOI layer of an UTSOI region of the substrate.

The insulating layer 14, which is located between the first semiconductor layer 16 and the second semiconductor layer 12, has a variable thickness depending upon the initial wafers used to create the substrate 10. Typically, however, the insulating layer 14 has a thickness from about 100 nm to about 500 nm, with a thickness from about 1 nm to about 5 nm being more typical. The insulating layer 14 is an oxide or other like insulator material that is formed on one or both of the wafers prior to bonding.

The second semiconductor layer 12 is comprised of any semiconducting material which may be the same or different from that of the first semiconductor layer 16. Thus, second semiconductor layer 12 may include, for example, Si, SiC, SiGe, SiGeC, Ge alloys, GaAs, InAs, InP as well as other III/V or II/VI compound semiconductors. Second semiconductor layer 12 may also comprise an SOI layer of a preformed SOI substrate or a layered semiconductor such as, for example, Si/SiGe. The second semiconductor layer 12 has the same crystalline orientation as the first semiconductor layer 16, preferably being in the (100) crystal plane. Although a (100) crystal orientation is preferred, the second semiconductor layer 12 may have a (111) crystal plane, (110) crystal plane or other crystal plane, so long as the second semiconducting layer 12 is not a Si-containing material that is subsequently processed to provide an nFET device on a (110) crystal plane.

The thickness of the second semiconductor layer 12 may vary depending on the initial starting wafers used to form the substrate 10. Typically, however, the second semiconductor layer 12 has a thickness from about 5 nm to about 200 nm, with a thickness from about 5 to about 100 nm being more typical.

Figure 2A:
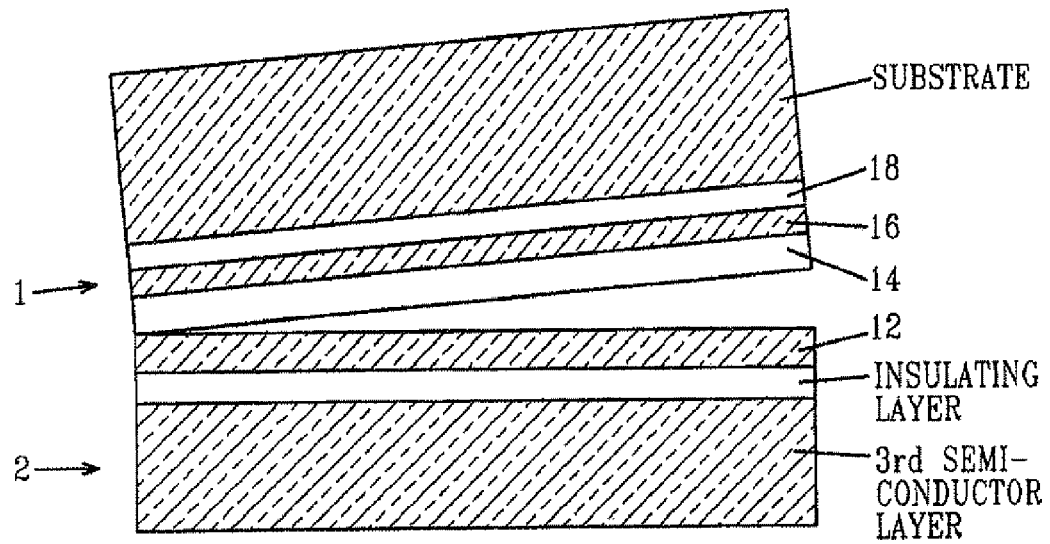
FIGS. 2A-2C are pictorial representations of various wafers that may be bonded together and used in the method described in FIGS. 1A-1F.
Figure 2B:
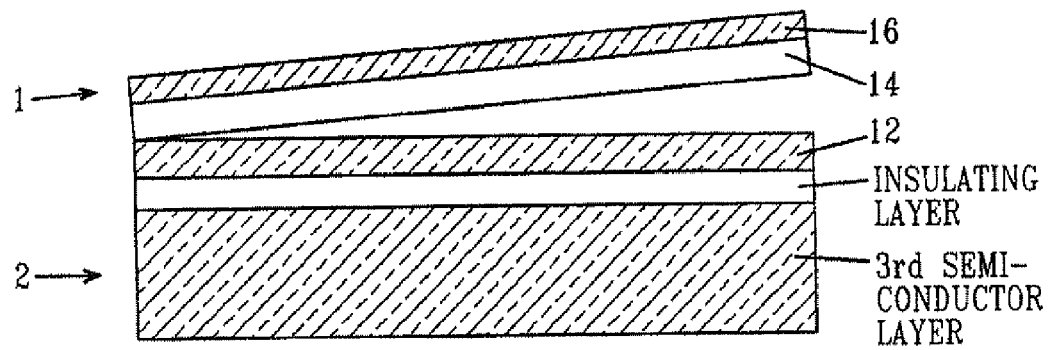
Figure 2C:
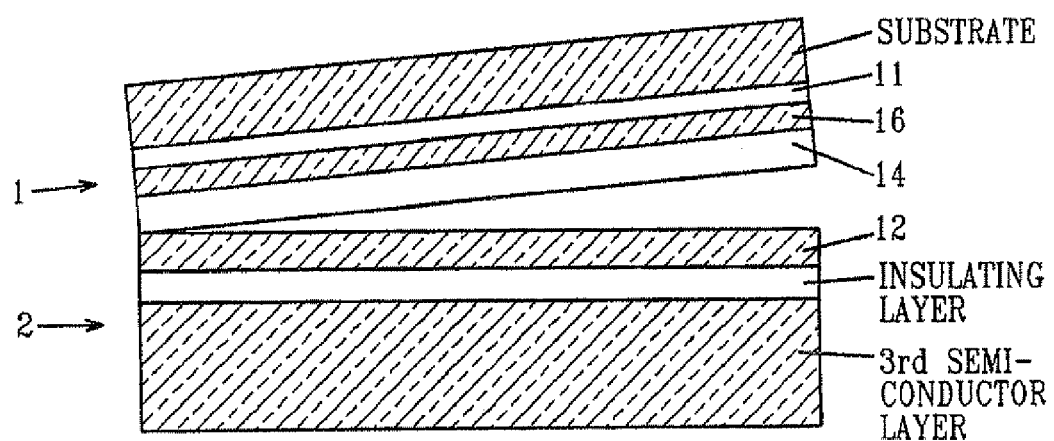

The substrate 10 illustrated in FIG. 1A is comprised of two semiconductor wafers that are bonded together. The two wafers used in fabricating the substrate 10 may include two SOI wafers (See, FIG. 2A), wherein one of the wafers, designated as 1, includes the first semiconductor layer 16 and the other wafer, designated as 2 includes the second semiconductor 12; an SOI wafer (designated as 2) and a bulk semiconductor wafer (designated as 1; see, FIG. 2B); or an SOI wafer (designated as 2) and a bulk wafer (designated as 1) which includes an ion implant region 11, such as a $H_2$ implant region, which can be used to split a portion of at least one of the wafers during bonding (See FIG. 2C).

Bonding is achieved by first bringing the two wafers into intimate contact with other, optionally applying an external force to the contacted wafers, and then heating the two contacted wafers under conditions that are capable of bonding the two wafers together. The heating step may be performed in the presence or absence of an external force. The heating step is typically performed in an inert ambient at a temperature from about 200° to about 1050° C. for a time period from about 2 to about 20 hours. More preferably, the bonding is performed at a temperature from about 200° to about 400° C. for a time period from about 2 to about 20 hours. The term "inert ambient" is used in the present invention to denote an atmosphere in which an inert gas, such as He, Ar, $N_2$, Xe, Kr or a mixture thereof, is employed. A preferred ambient used during the bonding process is $N_2$.

In the embodiment where two SOI wafers are employed, some material layers of at least one of the SOI wafers may be removed after bonding utilizing a planarization process such as chemical mechanical polishing (CMP) or grinding and etching. The planarization process stops when the surface dielectric layer 18 is reached.

In the embodiment in which one of the wafers includes an ion implant region, the ion implant region forms a porous region during bonding which causes a portion of the wafer above the ion implant region to break off leaving a bonded wafer such as is shown, for example, in FIG. 1A. The implant region is typically comprised of $H_2$ ions which are implanted into the surface of the wafer utilizing ion implantation conditions that are well known to those skilled in the art.

In the embodiment where the wafers to be bonded do not include a dielectric layer therein, the surface dielectric layer 18 may be formed atop the bonded wafers by a thermal process, such as oxidation, or by a conventional deposition process, such as chemical vapor deposition (CVD), plasma-enhanced CVD, atomic layer deposition, chemical solution deposition as well as other like deposition processes.

Figure 1B:
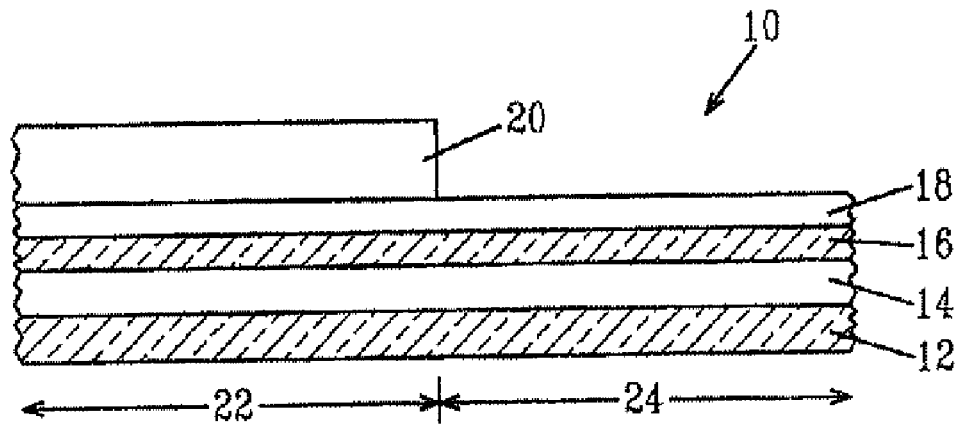

Referring now to FIG. 1B, a mask 20 is formed on a predetermined portion of the substrate 10 of FIG. 1A so as to protect a portion of the substrate 10, while leaving another portion of the substrate 10 unprotected. The protected portion of the substrate 10 defines a UTSOI region 22 of the substrate, whereas the unprotected portion of the substrate 10 defines a bulk-Si region 24. In one embodiment, the mask 20 is formed on a predetermined portion of the surface dielectric layer 18 by applying a photoresist mask to the entire surface of the substrate 10. After application of the photoresist mask, the mask is patterned by lithography, which includes the steps of exposing the photoresist to a pattern of radiation and developing the pattern utilizing a resist developer. The resultant structure including the mask 20 formed on a predetermined portion of the substrate 10 is shown, for example, in FIG. 1B.

In another embodiment, mask 20 is a nitride or oxynitride layer that is formed and patterned utilizing lithography and etching. The nitride or oxynitride mask 20 may be removed after defining the bulk-Si region 24 of the substrate 10.

After forming the mask 20 atop the substrate 10, the structure is subjected to one or more etching steps so as to expose a surface of the second semiconductor layer 12. Specifically, the one or more etching steps used at this point of the present invention removes the unprotected portions of the surface dielectric layer 18, as well as underlying portions of the first semiconductor layer 16, and a portion of the insulating layer 14 which separates the first semiconductor layer 16 from the second semiconductor layer 12. The etching may be performed utilizing a single etching process or multiple etching steps may be employed. The etching used at this point of the present invention may include a dry etching process such as reactive-ion etching, ion beam etching, plasma etching or laser etching, a wet etching process wherein a chemical etchant is employed or any combination thereof. In a preferred embodiment of the present invention, reactive-ion etching (RIE) is used in selectively removing the unprotected portions of the surface dielectric layer 18, the first semiconductor layer 16 and the insulating layer 14 in the bulk-Si region 24. The resultant structure after the etching process has been performed is shown, for example, in FIG. 1C. Note that the sidewalls of the protected UTSOI region 22, i.e., the surface dielectric layer 18, the first semiconductor layer 16, the insulating layer 14 and the second semiconductor layer 12, are exposed after this etching step. As shown, the exposed sidewalls of layers 18, 16 and 14 are aligned with an outer most edge of mask 20.

Figure 1C:
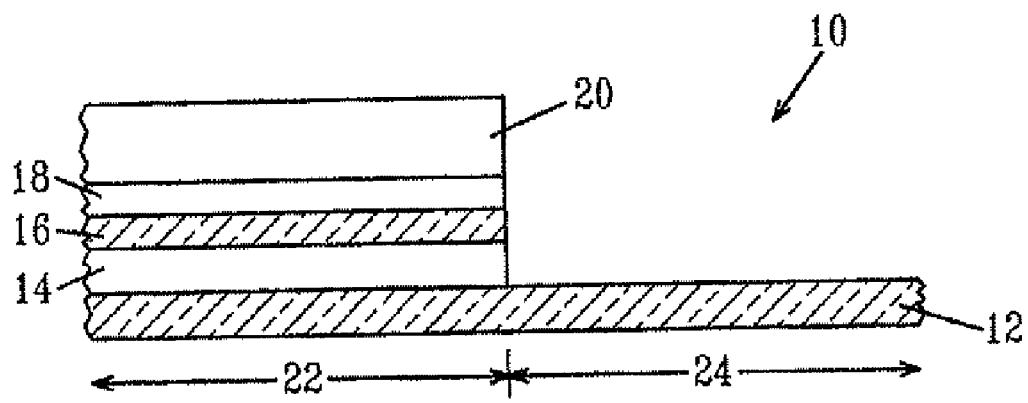

The mask 20 is then removed from the structure shown in FIG. 1C utilizing a conventional resist stripping process and then a liner or spacer 25 is typically formed on the exposed sidewalls. The liner or spacer 25, which is optional, is formed by deposition and etching. The liner or spacer 25 is comprised of an insulating material such as, for example, an oxide.

After forming the optional liner or spacer 25, a semiconductor material 26 is formed on the exposed second semiconductor layer 12. In accordance with the present invention, semiconductor material 26 has a crystallographic orientation that is the same as the crystallographic orientation of the second semiconductor layer 12. The resultant structure is shown, for example, in FIG. 1D.

The semiconductor material 26 may comprise any Si-containing semiconductor, such as Si, strained Si, SiGe, SiC, SiGeC or combinations thereof, which is capable of being formed utilizing a selective epitaxial growth method. In some preferred embodiments, semiconductor material 26 is comprised of Si. In the present invention, semiconductor material 26 may be referred to as a regrown semiconductor material 26.

Figure 1D:
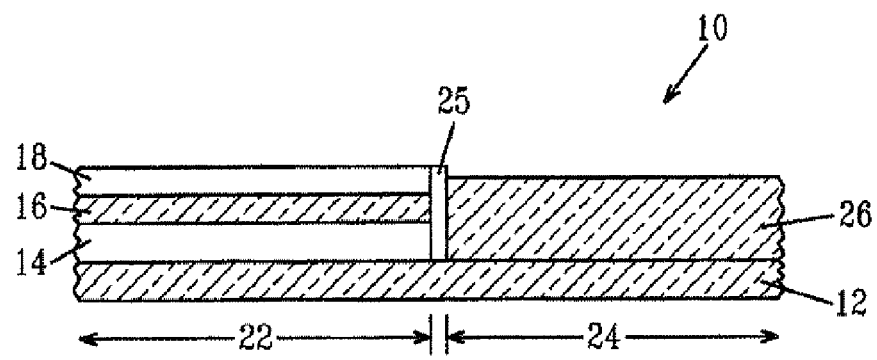

Next, the structure shown in FIG. 1D is subjected to a planarization process such as chemical mechanical polishing (CMP) or grinding such that the upper surface of the semiconductor material 26 is substantially planar with the upper surface of the first semiconductor layer 16. Note that previously protected portion of the surface dielectric layer 18 is removed during this planarization process.

After providing the substantially planar surfaces, an isolation region 27, such as a shallow trench isolation region, is typically formed so as to isolate the UTSOI device region 22 from the bulk-Si device region 24. The isolation region 27 is formed utilizing processing steps that are well known to those skilled in the art including, for example, trench definition and etching; optionally lining the trench with a diffusion barrier; and filling the trench with a trench dielectric such as an oxide. After the trench fill, the structure may be planarized and an optional densification process step may be performed to densify the trench dielectric.

Figure 1E:
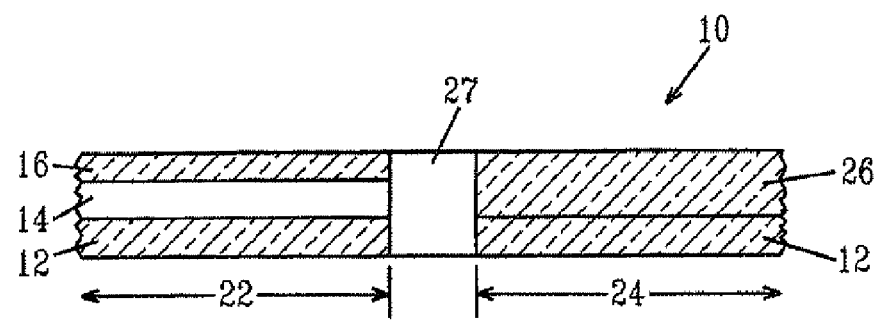

The resultant substantially planar structure containing isolation region 27 is shown, for example, in FIG. 1E. As shown, the structure of FIG. 1B includes an exposed first semiconductor layer 16 within the UTSOI device region 22 and the regrown semiconductor material 26 within the bulk-Si device region 24, wherein the first semiconductor layer 16 and the semiconductor material 26 have the same crystal orientation, preferably having a surface in the (100) crystal plane.

Figure 1F:
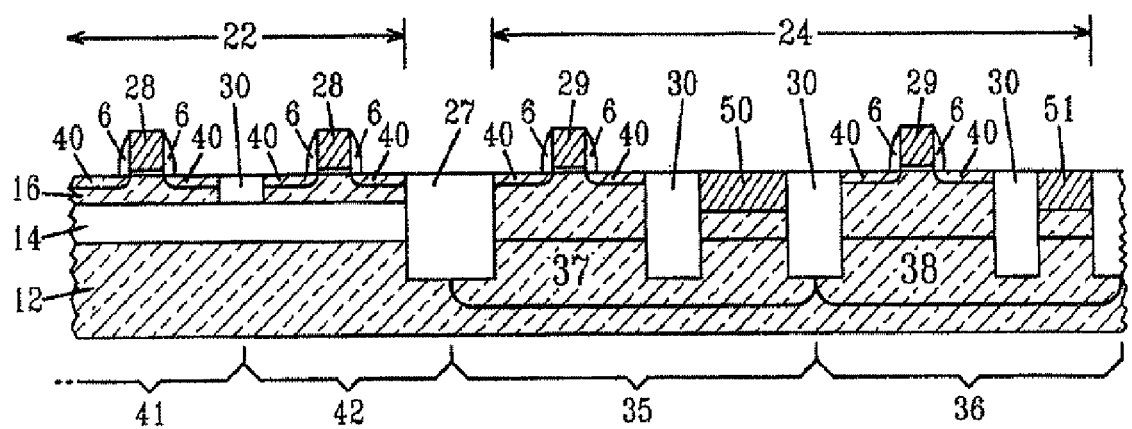

Referring to FIG. 1F, in a next process step, the UTSOI region 22 is processed to provide UTSOI MOSFETs and the bulk-Si region 24 is processed to provide devices having body contacts that substantially eliminate floating body effects.

Prior to processing the UTSOI region 22 and bulk-Si region 24, device isolation regions may be formed within the substrate 10. Device isolation regions 26 can be provided by selectively etching trenches in the substrate utilizing a conventional dry etching process, such as reactive-ion etching (RIE) or plasma etching, in conjunction with conventional block masks. The device isolation regions 26 provide isolation between within the bulk-Si device region 24 and the UTSOI device region 22 and are similar to the isolation region 27 that separates the bulk-Si device region 24 from the UTSOI device region 22. Alternatively, the device isolation regions 26 may be field isolation regions. Field isolation regions may be formed using a local oxidation of silicon process.

The UTSOI region 22 and the bulk-Si region 24 may be individually processed utilizing conventional block mask techniques. A block mask may comprise conventional soft and/or hardmask materials and can be formed using deposition, photolithography and etching. In a preferred embodiment, the block mask comprises a photoresist. A photoresist block mask can be produced by applying a blanket photoresist layer to the substrate 10 surface, exposing the photoresist layer to a pattern of radiation, and then developing the pattern into the photoresist layer utilizing conventional resist developer.

Alternatively, the block mask can be a hardmask material. Hardmask materials include dielectrics systems that may be deposited by chemical vapor deposition (CVD) and related methods. Typically, the hardmask composition includes silicon oxides, silicon carbides, silicon nitrides, silicon carbonitrides, etc. Spin-on dielectrics may also be utilized as a hardmask material including but not limited to: silsequioxanes, siloxanes, and boron phosphate silicate glass (BPSG).

Well regions 37, 38 may be formed in the bulk-Si region 24 by selectively implanting p-type or n-type dopants into the bulk-Si region 24 of the substrate 10, wherein the UTSOI region 22 of the substrate 10 may be protected by a block mask as described above. In the example depicted in FIG. 1F, a pFET bulk-Si device region 35 is implanted to provide an n-type well 37 and an nFET bulk-Si device region 36 is implanted to provide a p-type well 38. The SOI layer may also be selectively implanted in the UTSOI region 22. In the example depicted by FIG. 1F, a pFET UTSOI region 41 is implanted to provide a n-type channel region and an nFET UTSOI region 42 is implanted to provide a p-type channel region.

The gate conductor stacks 28, 29 are then be formed within the UTSOI region 22 and bulk-Si region 24 by first blanket depositing a gate dielectric layer atop the substrate surface and then depositing a gate conductor layer atop the gate dielectric layer. The gate dielectric layer may comprise any conventional gate dielectric material, such as $SiO_2$, or any high-k gate dielectric material, such as $HfO_2$. The gate conductor layer may comprise any conductive material, such as doped polysilicon. The gate conductor and gate dielectric layer are then etched using conventional deposition, photolithography, and etch processes to provide gate conductor stacks 28, 29 within the UTSOI region 22 and bulk-Si region 24 of the substrate 10, as depicted in FIG. 1F. Alternatively, block masks may be used to provide the gate conductor stacks 28 within the UTSOI region 22 and the gate conductor stacks 29 within the bulk-Si region 24 separately.

In the embodiment depicted in FIG. 1F, during a next series of process steps, UTSOI MOSFET devices are then selectively formed within the UTSOI region 22, while the bulk-Si region 24 is protected by a hard or soft block masks. For example, a block-mask provided by patterned photoresist can be formed prior to implantation to preselect the substrate area within the UTSOI region 22 for the gate conductor and/or source/drain diffusion region 40 doping with one dopant type. The block-mask application and implantation procedure can be repeated to dope selected gate conductors 28, source/drain diffusion regions 40, source/drain extension regions or halo regions (not shown) with different dopant types, such as n-type or p-type dopant. After each implant, the block mask resist may be removed using conventional photoresist strip chemistries. In one preferred embodiment, the pattern and implant process steps may be repeated to provide at least one pFET device 41 and at least one nFET 42 device, in which the pFET and nFET devices 41, 42 are separated by isolation region 26.

Prior to implantation, spacers 6 are formed abutting the gate stacks 28, wherein the width of the spacer may be adjusted to compensate for different diffusion rate of the p-type and n-type dopants. In addition, a raised source and drain (RSD) region can be optionally grown via epitaxial growth and it may be present since it typically is a common feature for certain UTSOI devices to lower silicide contact resistance. Further, the pFET and nFET devices within the UTSOI region 22 may be processed to provide silicide regions or any other conventional structures typically utilized in ultra-thin channel MOSFETS. Following the formation of the devices 41, 42 within the UTSOI region 22, the hardmask may be stripped from the bulk-Si region 24 and another hardmask is then formed atop the UTSOI region 22 of the substrate 10 leaving the bulk-Si region 24 exposed.

The bulk-Si device region 24 can then be processed to provide devices having increased performance on a bulk-Si substrate, as opposed to an UTSOI region. For example, the bulk-Si region 24 may be processed to provide devices typically common in semiconductor manufacturing, such as resistors; capacitors, including decoupling capacitors, planar capacitors, and deep trench capacitors; diodes; and memory devices, such as dynamic random access memory (DRAM) and embedded dynamic random access memory (eDRAM). In a preferred embodiment, the bulk-Si region 24 comprises body contacts 50, 51. In one example, as depicted in FIG. 1F, the bulk-Si region 24 is processed to provide MOSFETS having body contacts 50, 51.

In the embodiment depicted in FIG. 1F, the bulk-Si region 24 is processed to provide at least one p-type MOSFET 35 and at least one n-type MOSFET 36 each having body contacts 50, 51, in which the p-type MOSFETs 35 are separated from the n-type MOSFETs 36 by device isolation regions 26. Similar to the devices formed within the UTSOI region 22, the bulk-Si region 24 may be selective implanted to provide p-type MOSFETs 35 and n-type MOSFETs 36 utilizing patterned block masks.

Following implantation, body contacts 50, 51 are formed to at least one device within the bulk-Si region 24 of the substrate 10. The body contact 50, 51 to each MOSFET device 35, 36 within the bulk-Si region 24 is in electrical contact to the well region of the device and is separated from the MOSFET's source and drain regions 40 by an isolation region 26.

The body contacts 50, 51 may be formed using photolithography, etching, and deposition. More specifically, body contacts 50, 51 may be formed by patterning a portion of the substrate 10 within the bulk-Si region 24 and etching the exposed surface to form via holes to at least one well region 37, 36 of at least one MOSFET 35, 36. The etch process can be a directional etch, such as reactive-ion etching. Following via formation, body contacts 50, 51 are then formed by depositing a conductive material into the via holes using conventional processing, such as CVD or plating. The conductive material may be doped polysilicon or a conductive metal. The conductive metal may include, but is not limited to: tungsten, copper, aluminum, silver, gold, and alloys thereof. In a preferred embodiment, the body contact 51 to the n-type MOSFET 36 is p-type doped polysilicon and the body contact 50 to the p-type MOSFET 35 is n-type doped polysilicon.

Note that the devices formed within the UTSOI region 22 and the devices formed within the bulk-Si region 24 of the substrate 10 are both formed atop surfaces having the same crystalline orientation. In a preferred embodiment, the devices within the UTSOI region 22 and the devices formed within the bulk-Si region 24 are both formed on a surface having a (100) crystal plane.

While the present invention has been particularly shown and described with respect to preferred embodiments thereof it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconducting device comprising:
providing a substrate comprising at least a first semiconductor layer and a second semiconductor layer separated by an insulating layer, said first semiconductor layer and said second semiconducting layer having a same crystalline orientation;
protecting a portion of the substrate to define an UTSOI region, while leaving another portion of the substrate unprotected, said unprotected portion of the substrate defining a bulk-Si region;
etching said unprotected portion of the substrate to expose a surface of the second semiconductor layer;
forming a first isolation region on a sidewall of the portion of the substrate that defines the UTSOI region;
regrowing a semiconductor material on said exposed surface of the second semiconductor layer to provide the semiconductor material of the bulk-Si region, said semiconductor material of the bulk-Si region having said same crystalline orientation, wherein the first isolation region isolates the first semiconductor layer of the UTSOI region from the semiconductor material of the bulk-Si region;
planarizing the substrate containing the semiconductor material so that an upper surface of the first semiconductor layer is substantially planar with an upper surface of the semiconductor material; and
forming at least one first device in said UTSOI region, while forming at least one second device on said semiconductor material in said bulk-Si region, wherein said forming the at least one second device within said bulk-Si region further comprises implanting said bulk-Si region with a first dopant to provide a well region, forming at least one gate region atop a surface of said bulk-Si region, forming source and drain regions adjacent said at least one gate region with a second type dopant, and forming a contact to said well region in direct contact with the semiconductor material in the bulk-Si region, wherein the contact is isolated from the source and drain regions by a second isolation region that is present between the contact and the source drain regions, in which said contact stabilizes floating body effects.

2. The method of claim 1 wherein said first semiconductor layer has a thickness of less than about 40 nm.

3. The method of claim 1 wherein said forming the contact to said well region comprises etching a portion of said surface of said bulk-Si region to provide a via to said well region; and filling said via to said well region with a conductive material.

4. The method of claim 1 wherein said forming the at least one second device within said bulk-Si region further comprises providing capacitors, resistors, diodes or a combination thereof.

5. The method of claim 1 wherein said at least one device within said SOI region comprises nFETs, pFETs or a combination thereof.

6. The method of claim 1 wherein said substrate is formed from two silicon-on-insulator (SOI) wafers, a SOI wafer and a bulk semiconductor wafer, two bulk semiconductor wafers, or a SOI wafer and a bulk semiconductor wafer which contains an ion implant region which forms voids after heating, wherein said substrate is formed by bringing two wafers into intimate contact with each other and heating the contacted wafers in an inert ambient.

7. The method of claim 1 wherein said semiconductor material is formed utilizing a selective epitaxial growth method, said semiconductor material being a Si-containing semiconductor selected from the group consisting of Si, strained Si, SiGe, SiC, SiGeC and combinations thereof.

8. The method of claim 1 wherein said first semiconductor layer and said second semiconductor material comprise a same of different Si containing material, wherein said Si-containing material is selected from the group consisting of Si, strained Si, SiGe, SiC, SiGeC and combinations thereof.

9. The method of claim 1 further comprising forming the first isolation regions after etching, but prior to forming the at least one semiconductor devices.

10. The method of claim 1 wherein said same crystallographic orientation is (110).

11. The method of claim 1 wherein said first semiconductor layer is thinned by oxidation and wet etching.

12. The method of claim 1 wherein said same crystalline orientation is (111).

* * * * *